United States Patent
Huang

(10) Patent No.: US 9,852,024 B2
(45) Date of Patent: Dec. 26, 2017

(54) APPARATUS AND METHOD FOR READ TIME CONTROL IN ECC-ENABLED FLASH MEMORY

(71) Applicant: Winbond Electronics Corporation, Taichung (TW)

(72) Inventor: Koying Huang, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 0 days.

(21) Appl. No.: 15/132,771

(22) Filed: Apr. 19, 2016

(65) Prior Publication Data

US 2017/0300378 A1    Oct. 19, 2017

(51) Int. Cl.
| | |
|---|---|
| *G06F 11/10* | (2006.01) |
| *G11C 16/28* | (2006.01) |
| *G11C 29/52* | (2006.01) |
| *G06F 3/06* | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G11C 16/28* (2013.01); *G11C 29/52* (2013.01)

(58) Field of Classification Search
CPC .................................................. G06F 11/1076
USPC ................. 714/764, 763, 770, 773
See application file for complete search history.

(56) References Cited

U.S. PATENT DOCUMENTS

| | | | |
|---|---|---|---|
| 5,596,539 A | | 1/1997 | Passow et al. |
| 5,966,389 A | * | 10/1999 | Kiehl .................. G06F 11/1008 714/763 |
| 9,501,354 B2 | * | 11/2016 | Murakami .......... G06F 11/1048 |
| 2005/0078587 A1 | * | 4/2005 | Narumi ................ G11B 7/0062 369/59.11 |
| 2005/0169078 A1 | | 8/2005 | Balasubramanian et al. |
| 2006/0034142 A1 | | 2/2006 | Ooishi et al. |
| 2007/0291550 A1 | * | 12/2007 | Yang .................... G11C 7/1039 365/185.28 |
| 2016/0104539 A1 | | 4/2016 | Kim et al. |

OTHER PUBLICATIONS

Extended European Search report issued in EP Application No. 16197518.0 dated May 26, 2017 (8 pages).

* cited by examiner

*Primary Examiner* — Fritz Alphonse
(74) *Attorney, Agent, or Firm* — Finnegan, Henderson, Farabow, Garrett & Dunner LLP

(57) ABSTRACT

In a flash semiconductor memory, sense and contiguous ECC coding operations are carried out over a range of $V_{CC}$ values without wasted time by allocating a predetermined number of clocks to the combined operations rather than to the individual operations and operating at higher frequency for high $V_{CC}$ values, and lower frequency for low $V_{CC}$ values.

12 Claims, 6 Drawing Sheets

APPARATUS AND METHOD FOR READ TIME CONTROL IN ECC-ENABLED FLASH MEMORY

BACKGROUND OF THE INVENTION

Field of the Invention

The present invention relates to digital memory devices, and more particularly to apparatus and methods for read time control in ECC-enabled flash memory.

Description of Related Art

Flash memory devices may include various types of memory arrays, including memory arrays such as NOR-type and NAND-type. NAND flash memory in particular has become increasingly popular due to its significant cost advantage. Moreover, NAND flash memory is now available in a variety of different interfaces, ranging from traditional NAND interfaces to low pin count Serial Peripheral Interfaces ("SPI"). However, NAND flash memory is susceptible to bad block conditions and occasional read errors, so that bad block management and error correction code ("ECC") processing are commonly used with such memory. ECC processing may be used with NOR-type memory arrays, but is less common.

ECC processing may be internal or external to the memory device. In many ECC implementations, an internal ECC calculation is done during page programming, and the resulting EEC information is stored in the area known as the spare area for each page. During the data read operation, the internal ECC engine verifies the data according to the previously-stored ECC information, and to a limited extent, makes the indicated corrections.

BRIEF SUMMARY OF THE INVENTION

It would be desirable to employ ECC in various types of flash memory devices over a wide supply voltage ("$V_{CC}$") range to improve memory reliability at fast read speeds.

One embodiment of the present invention is a semiconductor memory comprising: a flash memory array; a plurality of sense amplifiers coupled to the flash memory array; a plurality of fast memory elements coupled to the plurality of sense amplifiers; an error correction code ("ECC") circuit coupled to the fast memory elements; at least one dummy flash memory cell associated with the flash memory array; at least one dummy sense amplifier coupled to the dummy flash memory cell; a driver having an input coupled to the dummy sense amplifier and an output coupled to the fast memory elements; and a memory controller coupled to the flash memory array, the sense amplifiers, the dummy sense amplifier, and the ECC circuit. The memory controller comprises logic and memory elements for executing the functions of, at nominal $V_{CC}$ and at a first frequency, performing a sense operation and a contiguous ECC operation over a predetermined total number of clock pulses, and over respective numbers of clock pulses having a first ratio relationship; at high $V_{CC}$ and at a second frequency greater than the first frequency, performing the sense operation and the contiguous ECC operation over the predetermined total number of clock pulses, and over respective numbers of clock pulses having a second ratio relationship smaller than the first ratio relationship; and at low $V_{CC}$ and at a third frequency less than the first frequency, performing the sense operation and the contiguous ECC operation over the predetermined total number of clock pulses, and over respective numbers of clock pulses having a third ratio relationship greater than the first ratio relationship.

Another embodiment of the present invention is a method of performing an error correction code ("ECC") processed read of a flash memory array of a semiconductor memory, comprising: at nominal $V_{CC}$, operating the semiconductor memory at a first frequency, wherein a sense operation and a contiguous ECC operation occur over a predetermined total number of clock pulses, and over respective numbers of clock pulses having a first ratio relationship; at high $V_{CC}$, operating the semiconductor memory at a second frequency greater than the first frequency, wherein the sense operation and the contiguous ECC operation occur over the predetermined total number of clock pulses, and over respective numbers of clock pulses having a second ratio relationship smaller than the first ratio relationship; and at low $V_{CC}$, operating the semiconductor memory at a third frequency less than the first frequency, wherein the sense operation and the contiguous ECC operation occur over the predetermined total number of clock pulses, and over respective numbers of clock pulses having a third ratio relationship greater than the first ratio relationship.

DETAILED DESCRIPTION OF THE INVENTION

Flash memory devices are available in a variety of configurations, including serial and parallel NOR flash, and serial and parallel NAND flash. Such flash memory typically uses an array of sense amplifiers to read data from the flash memory array. These sense amplifiers are analog circuits which sense the data in an addressed set of memory cells, and enable the sensed data to be latched into an array (a single row or multiple rows) of fast memory elements for subsequent processing by digital circuits such as error correction coding ("ECC") circuits, which are used on-chip with NAND memory arrays and increasingly with NOR memory arrays. An illustrative type of sense amplifier is described in, for example, U.S. Pat. No. 8,953,384, issued Feb. 10, 2015 to Chan et al., which hereby is incorporated herein in its entirety by reference thereto. Illustrative types of fast memory elements, page buffers (which may include data register and a cache register), ECC circuits, and operation thereof are described in, for example, Winbond Electronics Corporation, W25N01GV: SpiFlash 3V 1G-Bit Serial SLC NAND Flash Memory with Dual/Quad SPI & Continuous Read: Preliminary Revision B, Hsinchu, Taiwan, R.O.C., Nov. 26, 2013; U.S. Pat. No. 8,667,368 issued Mar. 4, 2014 to Gupta et al.; U.S. Pat. No. 9,128,822 issued Sep. 8, 2015 to Michael et al.; and US Patent Application Publication No. 2014/0269065 published Sep. 18, 2014 in the name of Jigour et al.; all of which hereby are incorporated herein in their entirety by reference thereto.

Figure 1:
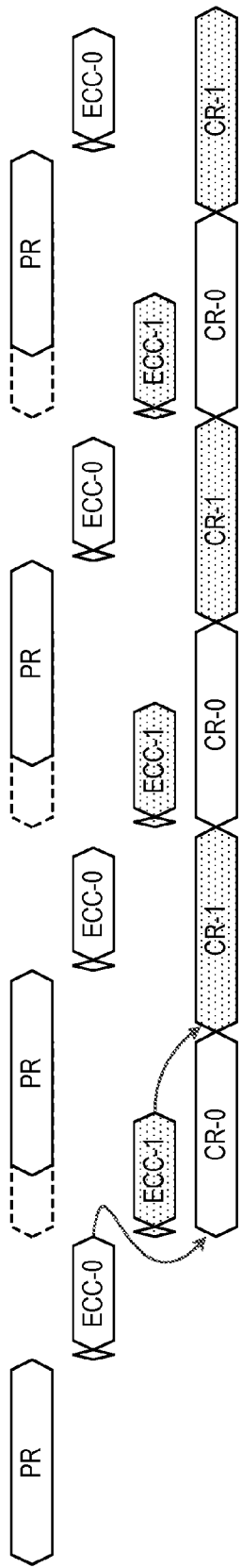
FIG. 1 is a diagram of various operations occurring during a continuous page read with ECC.

Fast read performance is desirable in a flash memory device. The continuous page read is a particularly advantageous type of high performance read for applications requiring execute-in-place and code shadowing. Fast read performance is available for low and moderate density memory devices using NOR flash; see, for example, Winbond Electronics Corporation, W25Q16DV Data Sheet: spiflash 3V 16M-Bit Serial Flash Memory with Dual and Quad SPI, Rev. I, Nov. 18, 2014. Fast read performance can also be achieved for high density memory devices using NAND flash. FIG. 1 shows a continuous page read for a NAND flash array which includes both sense and ECC operations. This timing example is described in the aforementioned U.S. Pat. No. 8,667,368 issued Mar. 4, 2014 to Gupta et al., which hereby is incorporated herein in its entirety by reference thereto.

Figure 2:
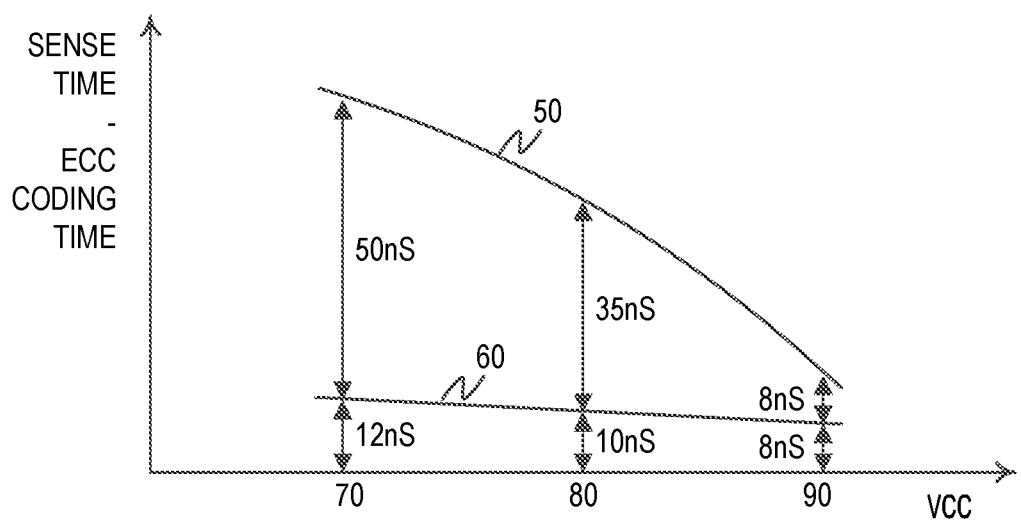
FIG. 2 is a graph of sense time and ECC coding time as a function of $V_{CC}$ for an illustrative example.
Figure 3:
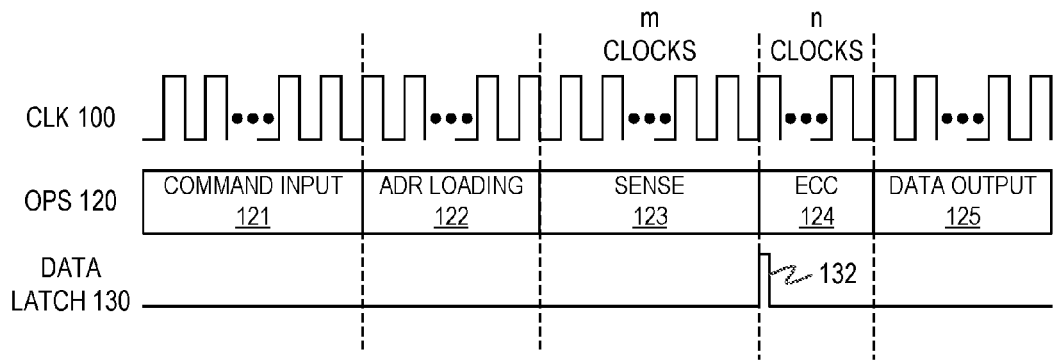
FIG. 3 is a timing diagram for reading a memory device at nominal $V_{CC}$.
Figure 4:
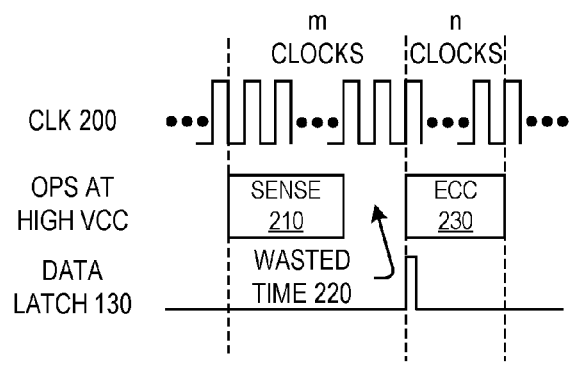
FIG. 4 is a timing diagram for reading a memory device at high $V_{CC}$.
Figure 5:
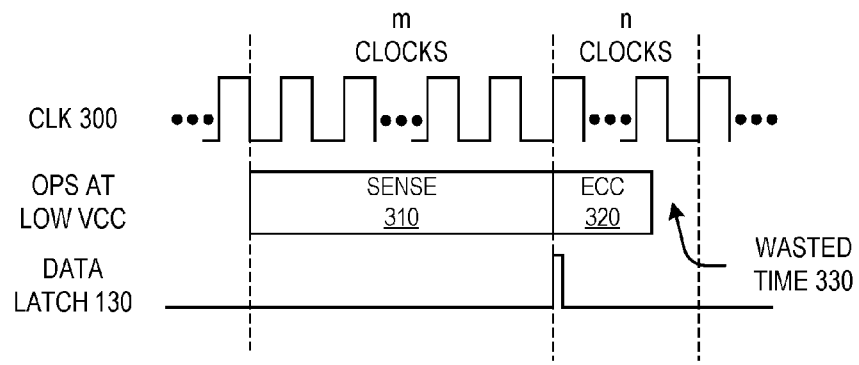
FIG. 5 is a timing diagram for reading a memory device at low $V_{CC}$.

While read performance typically is optimized for nominal supply voltage ("$V_{CC}$"), read performance may suffer when $V_{cc}$ is higher or lower than nominal. FIG. 2 shows the variation in sense time 50 and the variation in ECC coding time 60 over a $V_{CC}$ range. All values shown are illustrative, and may differ with differences in memory type and capacity. FIGS. 3, 4 and 5 show how variations in sense time 50 and in ECC coding time 60 over a $V_{CC}$ range affect read performance.

FIG. 3 is a simplified timing diagram of a read operation, which shows a clock signal CLK 100, various illustrative sequential operations 120 such as Command Input 121, Address Loading 122, Sense 123, ECC 124, and Data Output 125, and a Data Latch signal 130. The Data Latch signal 130 pulses at time 132 in order to latch the sensed data into an array of fast memory elements before commencement of the ECC operation 124. The Sense operation 123 has m clocks allocated to it, while the ECC operation 124 has n clocks allocated to it. At nominal $V_{CC}$ 80, illustratively 1.8 volts for example (another common nominal $V_{CC}$ is 3.3 volts), sense time illustratively is 35 ηs and ECC coding time illustratively is 10 ηs. The ratio of sense time to coding time therefore is 7:2, and "m" and "n" are established so that the ratio of m:n is also 7:2. In this way, both read time and ECC coding time are optimized and no time is wasted.

Unfortunately, performance may be quite different at higher $V_{CC}$ and lower $V_{CC}$ due to the sensitivity of the analog read sense circuits, and to a much lesser extent the digital ECC processing circuits, to variations in $V_{CC}$, temperature, and process parameters.

At high $V_{CC}$ 90, illustratively 1.9 volts for example, sense time illustratively may be 8 ηs and ECC coding time illustratively may be 8 ηs. In this case, the analog read sense circuits operate faster than the digital ECC processing circuits. As shown in FIG. 4, while n clocks are needed for the ECC operation 230, the analog sense operation 210 completes quickly, well prior to the duration of the m clocks, resulting in wasted time 220 when m:n is 7:2. The optimal m:n ratio at this particular value of high $V_{CC}$ is 2:2, which is quite different than 7:2.

At low $V_{CC}$ 70, illustratively 1.7 volts for example, sense time illustratively may be 50 ηs and ECC coding time illustratively may be 12 ηs. In this case, the analog read sense circuits operate slower than the digital ECC processing circuits. As shown in FIG. 5, while m clocks are needed for the analog sense operation 310, the ECC operation 320 completes quickly, prior to the duration of the n clocks, resulting in wasted time 330 when m:n is 7:2. The optimal m:n ratio at this particular value of low $V_{CC}$ is about 8.3:2, which is quite different than 7:2.

Figure 6:
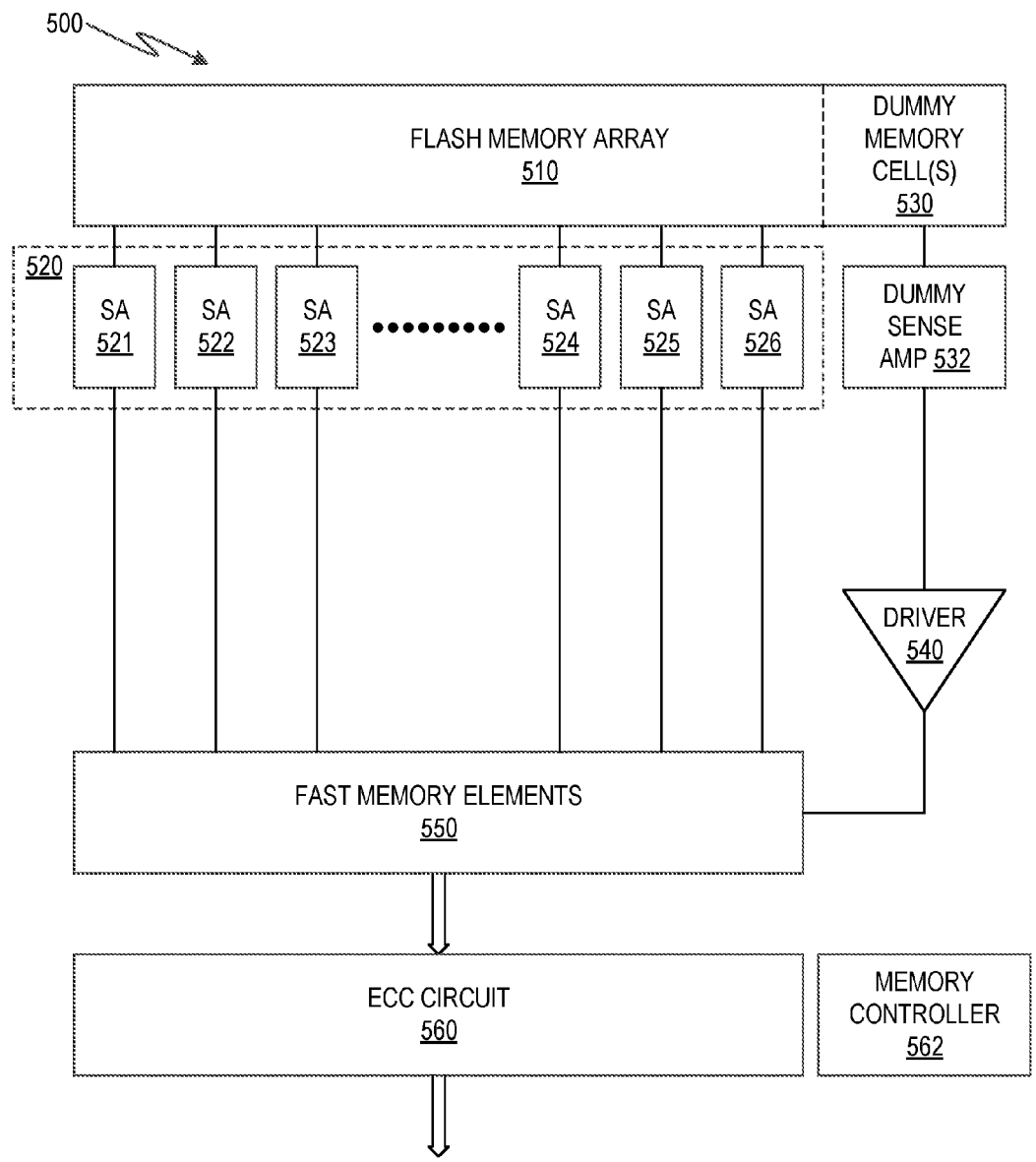
FIG. 6 is a schematic functional block diagram of a memory device.

FIG. 6 is a block schematic diagram of an illustrative memory device 500 in which sense and contiguous ECC coding operations are carried out over a range of $V_{CC}$ values without wasted time by allocating a predetermined number of clocks to the combined operations rather than to the individual operations and operating at higher frequency for high $V_{CC}$ values, and lower frequency for low $V_{CC}$ values. The memory device 500 uses at least one dummy sense amplifier and a dummy memory cell to control the data latch signal speed so that sense and ECC coding may occur without wasted time. The memory device 500, which is simplified to show illustrative read circuits, includes a addressable flash memory array 510 (addressing circuits omitted for clarity), which may be any suitable type or combination of types of flash memory cells and memory architecture for which ECC processing is necessary or desirable, including, for example, a NAND flash memory array or a NOR flash memory array, or a combination thereof. Multiple cells of the memory array 510 are sensed using an array 520 of sense amplifiers 521-526, and the digital values stored by the addressed cells are latched into an array 550 of fast memory elements. The array 550 may have any type of fast memory elements, such as a simple one dimensional array of data latch circuits as commonly used in NOR memory devices, or may be a more complicated array such as a page buffer having a data register that is organized in two portions and a cache register that is organized in two portions, as is particularly suitable for NAND memory devices and is more fully described in the aforementioned U.S. Pat. No. 8,667,368 issued Mar. 4, 2014, U.S. Pat. No. 9,128,822 issued Sep. 8, 2015, and US Patent Application Publication No. 2014/0269065 published Sep. 18, 2014, all of which hereby are incorporated herein in their entirety by reference thereto. The memory device 500 also includes an error correction circuit 560, which may be any type of ECC circuit implementing any type of suitable ECC algorithm, including either a unitary ECC circuit or an ECC circuit arranged in two or more sections corresponding to portions of the cache register in a page buffer, as more fully described in the aforementioned U.S. Pat. No. 8,667,368 issued Mar. 4, 2014, U.S. Pat. No. 9,128,822 issued Sep. 8, 2015, and US Patent Application Publication No. 2014/0269065 published Sep. 18, 2014, all of which hereby are incorporated herein in their entirety by reference thereto.

The memory device 500 also includes a dummy sense amplifier 532 and a driver 540. The dummy sense amplifier 532 may have the same or essentially the same circuit characteristics as the sense amplifiers 521-526 in the sense amplifier array 520. Upon completing a read operation of one or more dummy cells 530, the dummy sense amplifier 532 provides its output to a driver 540, which supplies a data latch signal to the data latch array 550 to latch the data and begin the ECC operation.

The memory device 500 also includes a memory controller 562 which is coupled to the circuits of the memory device 500 including the flash memory array 510, the sense amplifiers 520, the dummy sense amplifier 532, and the ECC circuit 560, and includes logic and memory elements such as registers for controlling the memory device 500.

Figure 7:
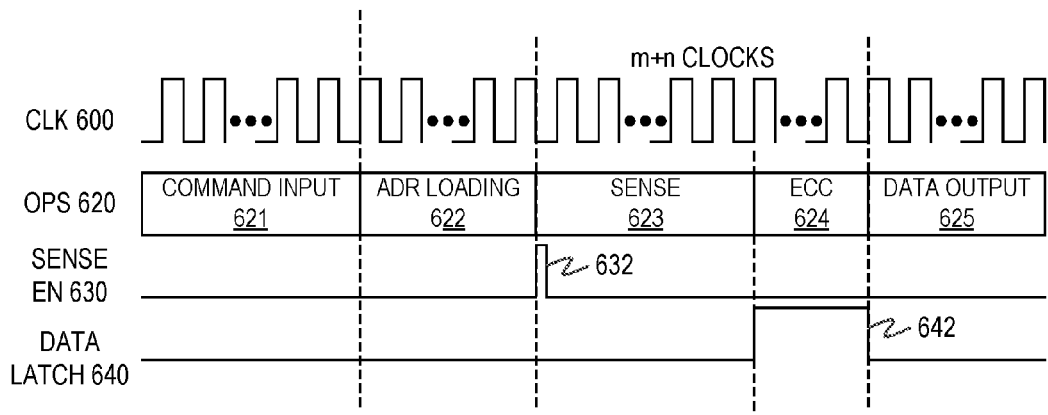
FIG. 7 is a timing diagram for reading the memory device of FIG. 6 at nominal $V_{CC}$.

FIG. 7 is a simplified timing diagram of a read operation for the memory device 500 at nominal $V_{CC}$. FIG. 7 shows a clock signal CLK 600, various illustrative operations 620 such as Command Input 621; Address Loading 622, Sense 623, ECC 624, and Data Output 625; a Dummy Sense and Main Array Sense Enable signal 630, and a Data Latch signal 640. A Data Latch pulse 642 occurs essentially at completion of the Sense operation 623 in order to latch the sensed data into the fast memory elements 550 and control commencement of the ECC operation 624. At nominal $V_{CC}$, the sense operation 623 and the ECC operation 624 occur over the sum of m+n clocks. Although the sense operation 623 as shown occurs over m clocks, and the ECC operation 624 as shown occurs over "n" clocks, this is only illustrative and does not mean that "m" clocks are allocated to the sense operation 623 or that "n" clocks are allocated to the ECC operation 624. Rather, the sum of m+n clocks is allocated to the combination of the sense operation 623 and the ECC operation 624. The total time is 35 ηs plus 10 ηs, or 45 ηs, so that the ratio of clocks for sense and ECC is 7:2 or 3.5, and no time is wasted at nominal $V_{CC}$.

Advantageously, the Sense operation 623 and the ECC operation 624 collectively occur during a time period of m+n clocks over the entire specified $V_{CC}$ range of operation, without constraining the sense operation 623 or the ECC operation 624 to any particular clock number m or n.

Figure 8:
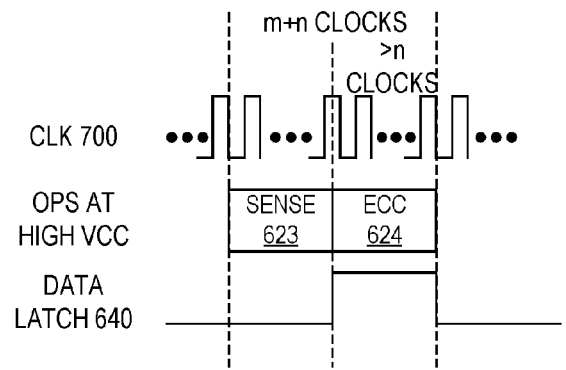
FIG. 8 is a timing diagram for reading the memory device of FIG. 6 at high $V_{CC}$.

FIG. 8 shows the timing of a read operation at high $V_{CC}$. At high $V_{CC}$, m+n fast clocks occur, and the clock speed and timing of the data latch signal are such that the ECC operation 624 follows essentially contiguous to, that is with negligible delay after, the sense operation 623, and with no wasted time. The considerably accelerated sense operation 623 occurs over fewer than m clocks, while the ECC operation 624 occurs over more than n clocks. The time for the sense operation and the ECC operation is 8 ηs and 8 ηs, so that the ratio of clocks for sense and ECC is 1:1 or 1.0 (less that 3.5 at nominal $V_{CC}$). The total time is 16 ηs (FIG. 2), so that the ratio for a clock number of 7+2=9, the product clock frequency is 562.5 MHz. Contrast the example of FIG. 8 with the example of FIG. 4, in which the maximum clock frequency is limited by ECC, for which the time is 8 ηs (FIG. 2) and the clock number 2, yielding a product clock frequency of 250 MHz. Therefore, the read operation of FIG. 8 using the implementation of FIG. 6 is capable of operation at a higher frequency than the read operation of FIG. 4, although in practice the maximum clock frequency may be limited by other design factors.

Figure 9:
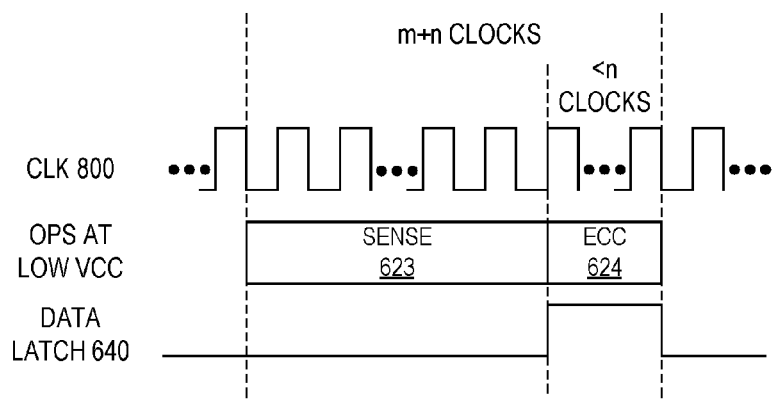
FIG. 9 is a timing diagram for reading the memory device of FIG. 6 at low $V_{CC}$.

FIG. 9 shows the timing of a read operation at low $V_{CC}$. At low $V_{CC}$, m+n slow clocks occur, and the clock speed and timing of the data latch signal are such that the ECC operation 624 follows essentially contiguous to, that is with negligible delay after, the sense operation 623, and with no wasted time. The considerably slowed down sense operation 623 occurs over more than m clocks, while the ECC operation 624 occurs over less than n clocks. The time for the sense operation and the ECC operation is 50 ηs and 12 ηs, so that the ratio of clocks for sense and ECC is 25:6 or 4.2 (greater that 3.5 at nominal $V_{CC}$). The total time is 62 ηs (FIG. 2), so that at a clock number of 7+2=9, the product clock frequency is 145 MHz, which is realizable in present designs. In the example of FIG. 5, the maximum clock frequency is limited by sensing, for which the time is 50 ηs (FIG. 2) at a clock number of 7, yielding a product clock frequency of 140 MHz. Therefore, the read operation of FIG. 9 using the implementation of FIG. 6 is capable of operation at a higher frequency than the read operation of FIG. 5.

Figure 10:
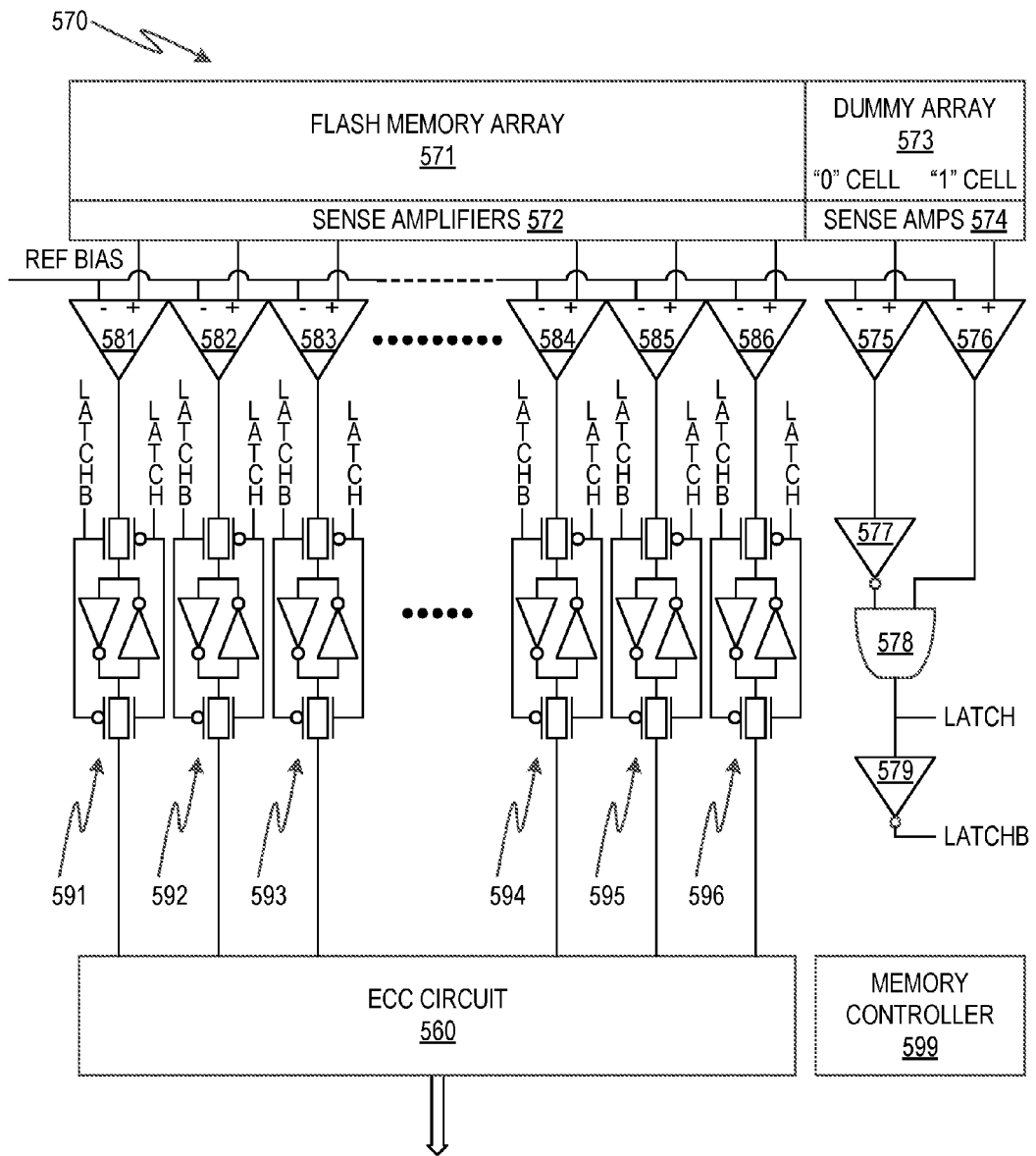
FIG. 10 is a schematic functional block diagram of a memory device which uses dummy zero-read and dummy one-read cells in a flash memory array along with respective dummy sense amplifiers to control a data latch array.

FIG. 10 is a block schematic diagram of an illustrative memory device 570 which is similar to the memory device 500 of FIG. 6 but includes additional implementation detail. The memory device 570 includes a flash memory array 571, and a dummy array 573 which includes a dummy read-zero cell and a dummy read-one cell. The dummy array 573 may be part of the main array 571, or may be a separate mini-array. Although only a single pair of dummy read-zero and dummy read-one cells is shown, more pairs may be used depending on the number sense and ECC sets in the memory device 570 (only one is shown for clarity), and whether a pair is associated with the entire memory, a block of memory, or a page of memory. The memory device 570 also includes sense amplifiers 572 for the flash memory array 571, and dummy sense amplifiers 574 for the dummy array 573. The outputs of the sense amplifiers 572 are compared with a REF BIAS voltage provided by a reference cell (not shown) in respective comparators 581-586 to determine the digital values stored in the addressed memory cells, which are then latched in respective latches 591-596. The outputs of the latches 591-596 are provided to the ECC circuit 560 for ECC processing, and may be provided to output circuits (not shown) for supplying the read data from the memory device 570. While only a single row array of latches 591-596 is shown, one or more additional rows of latches may be used, and the ECC circuit 560 may receive data from and furnish data to a different row or rows of latches.

Each of the latches 591-596 is shown as a gated D latch in pass transistor logic, and includes two cross-coupled inverters whose inputs and outputs are controlled by two pass gates in accordance with signals LATCH and LATCHB. The latches 591-596 are merely examples of one suitable type of fast digital memory element, and many different types of fast digital memory elements, including various types of flip-flops and latches, are suitable for use in flash memory devices and are well known in the art.

The outputs of the sense amplifiers 574 are compared with a REF BIAS voltage provided by a reference cell (not shown) in respective comparators 573-574 to generate the complementary data latch signals LATCH and LATCHB. The data latch signal LATCH corresponds to the data latch signal 640 (FIGS. 7, 8 and 9). The output of the comparator 575 as determined by the dummy read-zero cell is applied to the input of AND gate 578 through inverter 577, which the output of the comparator 576 as determined by the dummy read-one cell is applied to the second input of the AND gate 578. The difference in the sense time of the "0" cell and the "1" cell appears at the output of the AND gate 578 as a pulse, which is applied as signals LATCH and as LATCHB through inverter 579 to control the latches 591-596 and begin the ECC coding process. This implementation exposes the dummy read-zero cell and the dummy read-one cell in the dummy array 573, and the dummy sense amplifiers 574, to essentially the same voltage, process and temperature conditions as the flash memory cells in the array 571 and the sense amplifiers 572.

The memory device 570 also includes a memory controller 599 which is coupled to the circuits of the memory device 570 including the flash memory array 571, the sense amplifiers 572, the dummy sense amplifiers 574, and the ECC circuit 560, and includes logic and memory elements such as registers for controlling the memory device 570.

The dummy read-zero cell and the dummy read-one cell in the dummy array 573 may be trimmed to control the speed of the data latch signal LATCH and LATCHB, and thereby achieve a desired balance between read speed and quality. The dummy read-zero cell may be trimmed to have the slowest main array data read-zero speed, while the dummy read-one cell may be trimmed to have the slowest main array data read-one speed. A suitable margin-of-error may be provided if desired. The read speed of a flash memory cell may be dependent on the difference between the reference cell current and the memory cell current, which are applied as voltages (signal REF BIAS, for example) to the various comparators 581-586. Consider, for example, the case where the reference cell current is 12 μA, the minimum read-one cell current is 22 μA, and the maximum read-zero cell current is 2 μA. Illustratively, the dummy read-one cell current may be trimmed to 20 μA, and the dummy read-zero cell current may be trimmed to 4 μA. Trimming may be done in any known manner, such as by designing the dummy cells with a different loading than the memory cells, or by using multiple cells for each dummy memory cell, or by writing to the dummy memory cells.

When the sense operation is completed, the data latch signal may be used to power down or even power off the flash memory array 571 to reduce power consumption. Such control of power to the flash memory array 571 is particularly advantageous at low frequency.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. For example, specific values given herein are illustrative unless identified as being otherwise, and may be varied as a matter of design consideration. Terms such as "first" and "second" are distinguishing terms and are not to be construed to imply an order or a specific part of the whole. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A semiconductor memory comprising:
   a flash memory array;
   a plurality of sense amplifiers coupled to the flash memory array;
   a plurality of fast memory elements coupled to the plurality of sense amplifiers;
   an error correction code ("ECC") circuit coupled to the fast memory elements;
   at least one dummy flash memory cell associated with the flash memory array;
   at least one dummy sense amplifier coupled to the dummy flash memory cell;
   a driver having an input coupled to the dummy sense amplifier and an output coupled to the fast memory elements; and
   a memory controller coupled to the flash memory array, the sense amplifiers, the dummy sense amplifier, and the ECC circuit, and comprising logic and memory elements for executing the functions of:
   at nominal supply voltage ("$V_{CC}$") and at a first frequency, performing a sense operation and a contiguous ECC operation over a predetermined total number of clock pulses, and over respective numbers of clock pulses having a first ratio relationship;
   at high $V_{CC}$ and at a second frequency greater than the first frequency, performing the sense operation and the contiguous ECC operation over the predetermined total number of clock pulses, and over respective numbers of clock pulses having a second ratio relationship smaller than the first ratio relationship; and
   at low $V_{CC}$ and at a third frequency less than the first frequency, performing the sense operation and the contiguous ECC operation over the predetermined total number of clock pulses, and over respective numbers of clock pulses having a third ratio relationship greater than the first ratio relationship.

2. The semiconductor memory of claim 1 wherein the flash memory array comprises a NOR flash memory array.

3. The semiconductor memory of claim 1 wherein the flash memory array comprises a NAND flash memory array.

4. The semiconductor memory of claim 1 wherein the predetermined total number of clock pulses is 9, the first ratio relationship is 3.5, the second ratio relationship is 1.0, and the third ratio relationship is 4.2.

5. The semiconductor memory of claim 1 further comprising
   an additional dummy flash memory cell associated with the flash memory array, the dummy flash memory cell being a read-zero cell and the additional dummy flash memory cell being a read-one cell; and
   an additional sense amplifier coupled to the additional dummy flash memory cell;
   wherein the driver has an additional input coupled to the additional dummy sense amplifier.

6. The semiconductor memory of claim 5 wherein the driver comprises a logic circuit responsive to inputs from the sense amplifier and the additional sense amplifier to generate a latch control pulse.

7. A semiconductor memory comprising:
   a flash memory array;
   a plurality of sense amplifiers coupled to the flash memory array;
   a plurality of fast memory elements coupled to the plurality of sense amplifiers;
   an error correction code ("ECC") circuit coupled to the fast memory elements;
   a dummy read-zero flash memory cell associated with the flash memory array;
   a first dummy sense amplifier coupled to the read-zero dummy flash memory cell;
   a dummy read-one flash memory cell associated with the flash memory array;
   a second dummy sense amplifier coupled to the read-one dummy flash memory cell;
   a logic circuit having a first input coupled to the first dummy sense amplifier and a second input coupled to the second dummy sense amplifier to provide at an output thereof a latch control pulse as a function of differences in sense time of the first dummy sense amplifier and the second dummy sense amplifier, the output of the logic circuit being coupled to the fast memory elements; and
   a memory controller coupled to the flash memory array, the sense amplifiers, the dummy sense amplifier, and the ECC circuit, and comprising logic and memory elements for executing the functions of:

at nominal supply voltage ("$V_{CC}$") and at a first frequency, performing a sense operation and a contiguous ECC operation over a predetermined total number of clock pulses, and over respective numbers of clock pulses having a first ratio relationship;

at high $V_{CC}$ and at a second frequency greater than the first frequency, performing the sense operation and the contiguous ECC operation over the predetermined total number of clock pulses, and over respective numbers of clock pulses having a second ratio relationship smaller than the first ratio relationship; and at low $V_{CC}$ and at a third frequency less than the first frequency, performing the sense operation and the contiguous ECC operation over the predetermined total number of clock pulses, and over respective numbers of clock pulses having a third ratio relationship greater than the first ratio relationship.

8. The semiconductor memory of claim 1 wherein the flash memory array comprises a NOR flash memory array.

9. The semiconductor memory of claim 1 wherein the flash memory array comprises a NAND flash memory array.

10. A method of performing an error correction code ("ECC") processed read of a flash memory array of a semiconductor memory, comprising:

at nominal supply voltage ("$V_{CC}$"), operating the semiconductor memory at a first frequency, wherein a sense operation and a contiguous ECC operation occur over a predetermined total number of clock pulses, and over respective numbers of clock pulses having a first ratio relationship;

at high $V_{CC}$, operating the semiconductor memory at a second frequency greater than the first frequency, wherein the sense operation and the contiguous ECC operation occur over the predetermined total number of clock pulses, and over respective numbers of clock pulses having a second ratio relationship smaller than the first ratio relationship; and at low $V_{CC}$, operating the semiconductor memory at a third frequency less than the first frequency, wherein the sense operation and the contiguous ECC operation occur over the predetermined total number of clock pulses, and over respective numbers of clock pulses having a third ratio relationship greater than the first ratio relationship.

11. The method of claim 10 wherein the flash memory array comprises a NOR flash memory array.

12. The method of claim 10 wherein the flash memory array comprises a NAND flash memory array.

* * * * *